United States Patent [19]

Hawkins

[11] Patent Number: 4,559,086
[45] Date of Patent: Dec. 17, 1985

[54] BACKSIDE GETTERING OF SILICON WAFERS UTILIZING SELECTIVELY ANNEALED SINGLE CRYSTAL SILICON PORTIONS DISPOSED BETWEEN AND EXTENDING INTO POLYSILICON PORTIONS

[75] Inventor: Gilbert A. Hawkins, Mendon, N.Y.

[73] Assignee: Eastman Kodak Company, Rochester, N.Y.

[21] Appl. No.: 626,849

[22] Filed: Jul. 2, 1984

[51] Int. Cl.[4] .................. H01L 21/263; H01L 21/324
[52] U.S. Cl. .................... 148/1.5; 29/576 T; 29/576 W; 148/174; 148/175; 148/DIG. 3; 148/DIG. 24; 148/DIG. 48; 148/DIG. 60; 148/DIG. 61; 148/DIG. 71; 357/59
[58] Field of Search .......... 148/1.5, 174, 175, DIG. 3, 148/24, 48, 60, 61, 71, 123; 29/576 T, 576 W; 357/59

[56] References Cited

U.S. PATENT DOCUMENTS

| | | | |
|---|---|---|---|
| 3,698,947 | 10/1972 | Kemlage et al. | 148/174 X |
| 3,736,192 | 5/1973 | Tokuyama et al. | 357/59 X |
| 4,053,335 | 10/1977 | Hu | 148/174 |
| 4,131,487 | 12/1976 | Pearce et al. | 148/1.5 |
| 4,240,843 | 12/1980 | Celler et al. | 148/1.5 |
| 4,249,962 | 2/1981 | Celler | 148/1.5 |
| 4,257,827 | 3/1981 | Schwuttke et al. | 148/1.5 |
| 4,292,091 | 9/1981 | Togei | 29/576 W |
| 4,377,421 | 3/1983 | Wada et al. | 148/1.5 |

OTHER PUBLICATIONS

Beyer et al., "Gettering and Barrier Technique", I.B.M. Tech. Discl. Bull., vol. 19, No. 6, Nov. 1976, pp. 2050-2051.
Poponiak et al, "Gettering Utilizing—Disordered Epitaxial Layer", I.B.M. Tech. Discl. Bull., vol. 19, No. 6, Nov. 1976, pp. 2052-2053.

*Primary Examiner*—William G. Saba
*Attorney, Agent, or Firm*—Dana M. Schmidt

[57] ABSTRACT

There is disclosed a process and the resulting semiconductor wafer wherein the backside of the wafer has applied thereto a layer of polysilicon. Portions of this layer are exposed to an energy beam to recrystallize them into single crystal silicon fused to and extending from the underlying wafer. The recrystallized portions contact adjacent portions of the polysilicon layer, thereby providing a path for impurities migrating from the wafer to the polysilicon.

4 Claims, 5 Drawing Figures

BACKSIDE GETTERING OF SILICON WAFERS UTILIZING SELECTIVELY ANNEALED SINGLE CRYSTAL SILICON PORTIONS DISPOSED BETWEEN AND EXTENDING INTO POLYSILICON PORTIONS

FIELD OF THE INVENTION

This invention relates to a method for gettering silicon and the resulting wafer, such as are useful in making semiconductor devices.

BACKGROUND OF THE INVENTION

Backside gettering of impurities in silicon semiconductors is a common practice. For example, U.S. Pat. No. 4,053,335, issued on Oct. 11, 1977, describes the depositing of polycrystalline silicon, hereinafter polysilicon, on the backside of the silicon wafer. Thereafter, during high temperature processing, impurities are alleged to migrate into the polysilicon and become trapped in the polycrystalline grain boundaries.

There is little question that, once the impurities enter the polysilicon layer, they will be trapped by the grain boundaries. However, in practice it has been found that the polysilicon grain boundaries noted in U.S. Pat. No. 4,053,335, col. 3, lines 27-29 inhibit intimate molecular contact and thus prevent the impurities from migrating to the polysilicon in the first place. This condition is worsened if any silicon oxide is present, since the silicon oxides on the wafer further interfere with transfer of impurities to the polysilicon layer. Thus, the process described in U.S. Pat. No. 4,053,335 has not been optimally effective, so that the art has had to turn to other approaches.

For example, U.S. Pat. No. 4,131,487, issued on Dec. 26, 1978, describes a technique for backside gettering wherein crystal defects are *introduced* into a single crystal by scanning portions of it with a laser powered sufficiently to physically damage the crystal, and heating the device to cause the damage or defects to form dislocations. These dislocations act as gettering means or traps for impurities. Such a technique is disadvantageous because, as described in U.S. Pat. No. 4,257,827, issued on Mar. 24, 1981, unless the dislocation formation is done with care, the dislocations migrate to the front of the wafer and interfere with device performance. The alternative taught by U.S. Pat. No. 4,257,827 is to use a lower power laser that melts the backside of the wafer, and "activates" oxygen complexes as gettering centers. This process is disadvantageous in that (a) not all impurities are readily gettered by such a technique, and (b) minority carrier lifetimes decrease in the interior of the wafer due to damage to the single crystalline wafer from the incident laser beam and to formation of the oxygen complex gettering centers.

Thus, prior to the instant invention, conventional gettering techniques have suffered from serious drawbacks.

SUMMARY OF THE INVENTION

I have discovered that gettering techniques, and the resulting wafers, are available which avoid the drawbacks noted above. More specifically, I have found that a polysilicon layer on the backside of the wafer can be made to getter impurities without causing the wafer boundary to block migration, if the polysilicon layer is appropriately modified.

In accord with one aspect of the invention, there is provided a silicon wafer comprising a front side, a backside, and a layer of polysilicon in contact with at least a portion of the backside. The wafer is improved in that portions of the polysilicon are in contact with spaced-apart portions of single crystal silicon that extend epitaxially from the silicon wafer. As a result, the polysilicon portions that contact the single crystal portions act as gettering sites and the single crystal portions act as paths for impurities migrating to the gettering sites from the wafer.

In accord with another aspect of the invention, there is provided a method for gettering a silicon wafer having a front side and a backside. The method comprises the steps of (a) depositing a layer of polysilicon on at least a portion of the backside of the wafer; and (b) exposing spaced-apart portions of the polysilicon to energy having sufficient power to recrystallize the polysilicon that is so exposed, into single crystal silicon portions epitaxially extending from the underlying wafer, the single crystal portions being separated by and in contact with portions of the polysilicon layer not exposed to the energy.

Thus, this invention advantageously features a semiconductor wafer having gettering sites on the backside thereof which are easy to form and which are fully effective, that is, are not hindered by any boundary formed between the backside of the wafer and the deposited polysilicon.

A related advantageous feature of this invention is a method for forming such a wafer with gettering sites, using steps that solve problems existing with previous methods.

Other advantageous features will become apparent upon reference to the following "Description of the Preferred Embodiments" when read in light of the attached drawings.

DESCRIPTION OF THE PREFERRED EMBODIMENTS

The device and method of the invention are described in connection with a preferred embodiment in which the entire backside of a silicon wafer is coated with a polysilicon layer and selected portions thereof are converted by a laser beam into recrystallized single crystal silicon extending epitaxially from, that is, of the same crystalline structure as, the wafer. The recrystallized portions are in contact with portions of the polysilicon layer, preferably on each side of such recrystallized portions. In addition, the device and method of this invention are useful to provide recrystallized single crystal portions of any shape. Also, the invention can be practiced by contacting the polysilicon layer at only one side of a recrystallized portion. Such recrystallized portions provide gettering paths whether or not the polysilicon is formed as an overall layer or as portions of a layer. Also, recrystallizing forms of energy other than laser beams are useful, for example sufficiently powerful electron beams or incoherent radiation sources such as flash lamps.

A preferred form of the recrystallized portion is a stripe having roughly defined width, length and depth. In any case, such portion need not have a particular shape, such as a rectangle. As will be apparent from the described process, the edges of the recrystallized portion are so roughly defined that precise geometric shapes are not likely to occur. Furthermore, the recrystallized portions can be spaced in columns and/or in rows.

Also as used herein, "semiconductor device" refers to any electrical element that is manufactured in or on a silicon wafer. These include capacitors, transistors, diodes, resistors, photovoltaic cells etc., whether or not such an element exists in isolation or as part of an integrated circuit.

Figure 1:
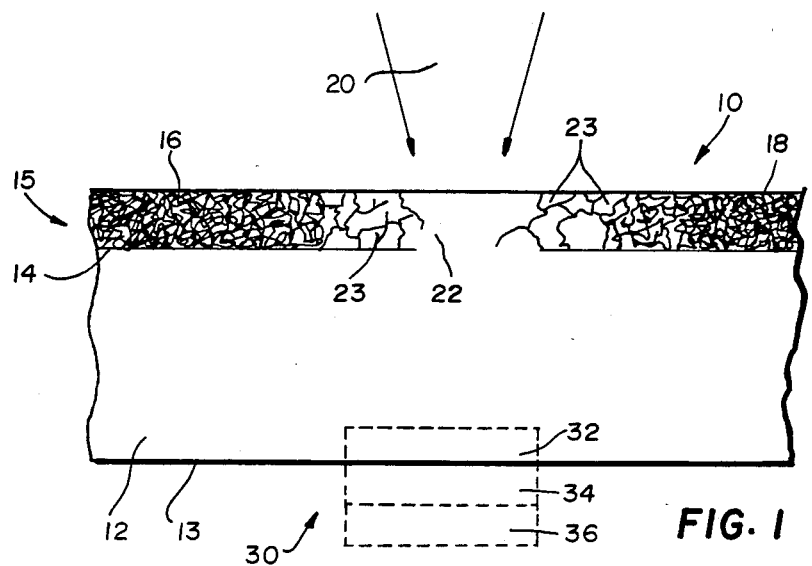
FIG. 1 is a fragmentary sectional view in elevation of a silicon wafer prepared in accordance with the invention.

FIG. 1 illustrates the process and the resulting product 10. A single crystal silicon wafer 12, appropriately doped for manufacturing semiconductor devices, has a front side 13 and a backside 14. Either before, during, or after the processing of the front side, a layer 15 of polysilicon is deposited onto backside 14. Such deposition is conventional, using for example, low pressure chemical vapor deposition (LPCVD), requiring no further elaboration.

Thereafter, selected portions of layer 15 are exposed to a laser beam 20 so as to recrystallize those portions into stripes 22 of single crystal silicon fused to and having the same crystalline structure as the underlying wafer 12. This is indicated by the absence of surface boundary 14 under stripes 22. Such stripes merge into and contact adjacent polycrystalline portions 16 and 18 by means of recrystallized crystal grains 23 that are not part of the structure of wafer 12. These recrystallized grains become smaller and smaller, as shown, as their distance increases from the center of stripe 22, until they are indistinguishable from the polysilicon.

The laser power needed to do this is that which will melt and recrystallize the polysilicon grains exposed by beam 20. The exact nature of the laser power depends on both the type of laser being used and the thickness and grain size of the layer 15. Such power can be, for example, between about 9 and about 20 watts when focused in a $1/e^2$ diameter of 10–1000 $\mu$m. Optionally, the exposure to the laser beam is done while the wafer is generally heated up to 500° C., so as to minimize the amount of laser power required. However, if greater amounts of laser power are used, e.g., about 20 watts, then external heating is not necessary.

A variety of dimensions is useful for layer 15. Most preferably, it has a thickness of between about 0.1 $\mu$m and about 10 $\mu$m and an average grain size of from about 5 to about 5000Å. In addition, however, thicknesses and grain sizes outside of these ranges are also useful.

The stripes 22 also can have a variety of configurations. Most preferably, the stripes have a width of between about 1 and about 100 $\mu$m, and are spaced apart, measured from center to center, by between about 50 $\mu$m and about 500 $\mu$m. In addition, widths and spacings outside of this range are useful.

The front side 13 of the wafer is processed, preferably thereafter as suggested by the dotted lines, into one or more semiconductor devices 30. For example, a portion 32 of the wafer is appropriately doped n- or p-type, and an oxide insulator layer 34 and an electrode layer 36 are formed thereon and defined by conventional processes, to make MOS capacitors or MOSFETS.

The method by which gettering occurs is as follows: During heating of the wafer, e.g., to form device 30 or some other device of the wafer, or during heating for gettering only, impurities diffuse from wafer 12 into stripe 22, since there is no grain boundary to intercept them. The impurities migrate into large crystals 23, and eventually are trapped (gettered) at the grain boundaries existing in or at the polysilicon portions 16 and 18.

Figure 2:
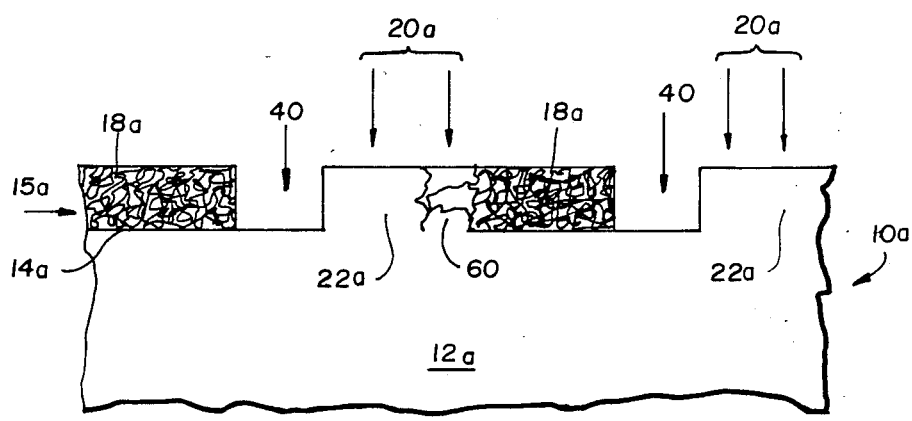
FIG. 2 is a view similar to that of FIG. 1 but illustrating an alternate embodiment.

The single crystal stripes 22 need not have polysilicon portions in contact with both longitudinal edges. In the embodiment of FIG. 2, polysilicon contacts only one edge portion of stripes 22a. Parts similar to those previously described bear the same reference numeral to which the distinguishing suffix "a" is appended. Thus, product 10a comprises a wafer 12a having backside 14a portions of which have formed thereon a layer 15a of polysilicon. Other portions of backside 14a can be exposed at 40, either during the initial deposition of the polysilicon, or by subsequent etching steps. Laser beam 20a is used to expose and recrystallize stripes 22a immediately adjacent to the exposed portions 40, so that stripes 22a are in contact with and merge into polysilicon portions 18a only along one edge 60 thereof.

Figure 3A:
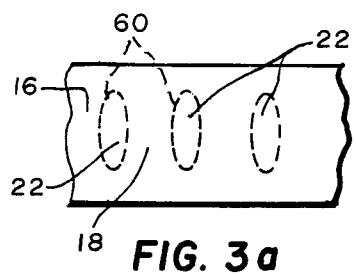
FIGS. 3a and 3b are fragmentary plan views showing possible formats of the stripes on the backside.
Figure 3B:
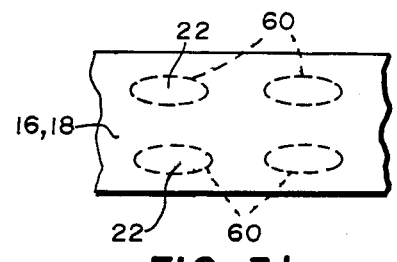

Many formats are possible for the single crystal stripes. They can be all in a row, FIG. 3a. Alternatively they can be in a single column, not shown, or in rows and columns, FIG. 3b. In the aforementioned figures, dotted lines 60 are positioned to generally, rather than precisely, delineate the boundary between the recrystallized portions 22 and the polysilicon portions 16 and 18.

EXAMPLES

The following examples further illustrate the invention.

Following the arrangement depicted in FIG. 1, a 0.5 $\mu$m thick film of polysilicon of average grain size of about 500Å was formed by LPCVD techniques at 625° C., onto the backside of a 0.5 mm thick silicon wafer. A cw Argon ion laser beam having a power of 13 watts, was focused to an $e^{-2}$ width of about 40 $\mu$m, and raster scanned at 10 cm/sec across the polysilicon layer while the wafer was held at 350° C. under ambient atmosphere pressure. The resulting stripes were about 40–50 $\mu$m wide, 6 cm long, and spaced apart, center to center, about 300 $\mu$m. Thereafter, MOS capacitors were fabricated on the front side of the wafer. Such fabrication included heating steps of up to about 1000° C., that caused gettering to occur.

Figure 4:
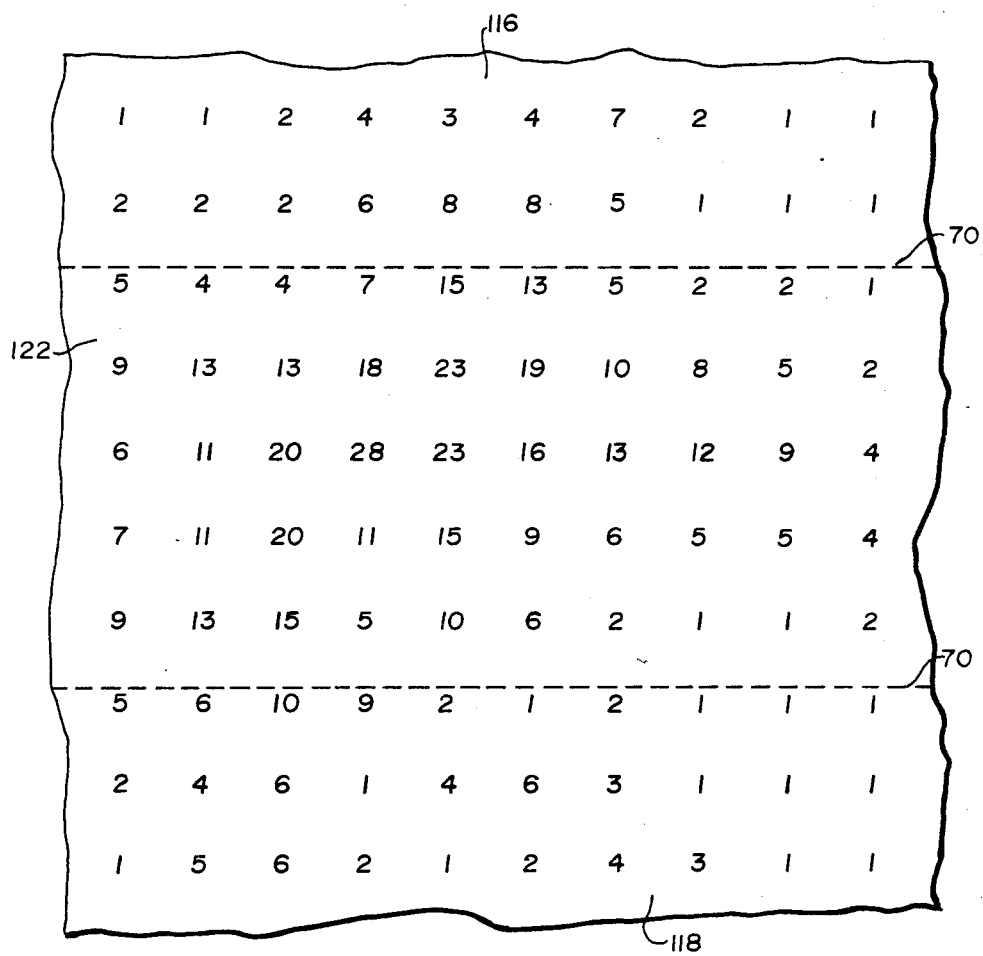
FIG. 4 is a schematic plan view of a portion of the front side of the wafer of FIG. 1, wherein the gettering of the silicon wafer is demonstrated by a map of the relative carrier lifetimes. (The devices on the wafer are omitted for clarity.)

Evidence of gettering was obtained for this example by determining minority carrier lifetimes (in $\mu$ sec) using the well-known method of capacitance recovery from deep depletion. FIG. 4 is a portion of a backside of a wafer processed in accordance with the invention, with an overlay of measured minority carrier lifetimes in $\mu$ sec. Because effective gettering will delete impurities that tend to reduce the minority carrier lifetimes, a measurement of enhanced minority carrier lifetimes means that gettering has occurred in the measured area. Therefore, enhancement of minority carrier lifetimes was observed on portions 122 for which the gettering procedure had been implemented, relative to control portions 116 and 118 for which no gettering was implemented. In the present example shown in FIG. 4, the portions 116 and 118 of the device overlying the polysilicon portions lacking recrystallization stripes were subjected to moderate contamination during processing as shown by depletion lifetimes of only 5 $\mu$sec, as an average. The lifetime in regions 122 overlying where the polysilicon had been laser fused in stripes showed an enhancement of roughly tenfold in minority carrier lifetimes. This established that laser melting of selected regions of deposited polysilicon films provides more effective gettering (longer carrier lifetimes) than was achieved by the application of the polysilicon layer alone. (Lines 70 are shown only to delineate which parts of the wafer were given laser stripe treatment (122) in their backside, and which were not.)

The invention has been described in detail with particular reference to preferred embodiments thereof, but it will be understood that variations and modifications can be effected within the spirit and scope of the invention.

What is claimed is:

1. In a silicon wafer comprising a front side adapted to be made into one or more semiconductor devices, a backside, and a layer of polysilicon in contact with at least a portion of said backside, the improvement comprising spaced-apart portions of single crystal silicon dispersed between and extending into said polysilicon layer, and recrystallized crystal grains transitionally connecting said single crystal portions with portions of said polysilicon layer, said portions of single crystal silicon extending expitaxially from said silicon wafer, whereby said polysilicon portions contacting said single crystal portions act as gettering sites and said single crystal portions act as paths for impurities migrating to said gettering sites from said wafer.

2. A wafer as defined in claim 1, wherein each of said single crystal portions is in contact with polysilicon portions on either side thereof.

3. A wafer as defined in claim 1, wherein said single crystal portions are between about 1 and about 100 $\mu$m wide and are spaced apart, center to center, by between about 50 and about 500 $\mu$m.

4. A wafer as defined in claim 1, wherein said polysilicon layer has a thickness of between about 0.1 $\mu$m and about 10 $\mu$m and an average grain size of from about 5 to about 5000Å.

* * * * *

UNITED STATES PATENT AND TRADEMARK OFFICE
CERTIFICATE OF CORRECTION

PATENT NO. : 4,559,086

DATED : December 17, 1985

INVENTOR(S) : Gilbert A. Hawkins

It is certified that error appears in the above-identified patent and that said Letters Patent are hereby corrected as shown below:

Column 6, line 9 should read -- ing epitaxially from said silicon wafer, --.

Signed and Sealed this

Eleventh Day of November, 1986

*Attest:*

DONALD J. QUIGG

*Attesting Officer*  *Commissioner of Patents and Trademarks*